United States Patent [19]

Hosaka

[11] Patent Number: 5,352,626
[45] Date of Patent: Oct. 4, 1994

[54] METHOD FOR MAKING A SEMICONDUCTOR DEVICE HAVING AN ISOLATED LAYER REGION ON THE SIDE WALL OF A GROOVE

[75] Inventor: Takashi Hosaka, Tokyo, Japan

[73] Assignee: Seiko Instruments Inc., Tokyo, Japan

[21] Appl. No.: 153,906

[22] Filed: Nov. 17, 1993

Related U.S. Application Data

[60] Division of Ser. No. 978,461, Nov. 19, 1992, Pat. No. 5,293,061, which is a continuation of Ser. No. 678,874, Apr. 4, 1991, abandoned.

[30] Foreign Application Priority Data

Apr. 9, 1990 [JP] Japan .................................. 2-94773

[51] Int. Cl.⁵ .............................................. H01L 21/76
[52] U.S. Cl. .......................................... 437/67; 437/69; 437/72; 437/73; 437/947; 148/DIG. 117
[58] Field of Search ........................ 437/69, 70, 72, 73, 437/67, 947; 148/DIG. 117

[56] References Cited

U.S. PATENT DOCUMENTS

| 4,533,429 | 8/1985 | Josquin | 437/69 |
| 4,689,871 | 9/1987 | Malhi | 257/662 |
| 4,926,231 | 5/1990 | Hwank et al. | 357/49 |
| 4,947,227 | 8/1990 | Teng | 357/622 |
| 4,975,759 | 12/1990 | Sidner et al. | 357/47 |
| 5,013,676 | 5/1991 | Horigome | 357/55 |
| 5,250,461 | 10/1993 | Sparks | 437/67 |

FOREIGN PATENT DOCUMENTS

0044580  4/1977  Japan .................................. 357/53

*Primary Examiner*—Tom Thomas
*Assistant Examiner*—Trung Dang
*Attorney, Agent, or Firm*—Spensley Horn Jubas & Lubitz

[57] ABSTRACT

Steps or grooves are formed in a surface of a semiconductor substrate of a semiconductor device having a plurality of semiconductor elements, and an isolation Layer is formed on regions that include the steps or side walls of the grooves.

2 Claims, 3 Drawing Sheets

METHOD FOR MAKING A SEMICONDUCTOR DEVICE HAVING AN ISOLATED LAYER REGION ON THE SIDE WALL OF A GROOVE

This is a division of application Ser. No. 07/978,461, filed on Nov. 19, 1992, now U.S. Pat. No. 5,293,061, which is a continuation of application Ser. No. 07/678,874, filed on Apr. 4, 1991, and now abandoned.

BACKGROUND OF THE INVENTION

1. Field of the Invention

The present invention relates to a semiconductor device having an isolation layer that physically and electrically isolates semiconductor elements such as transistors, resistors and the like.

2. Description of the Related Art

Such isolation layers have heretofore been formed to have a flat configuration on flat regions. As shown in FIG. 6, for instance, isolation layer regions 63 and impurity diffusion layer regions 64 are formed in the same plane of the surface of the semiconductor substrate 61, each isolation layer region 63 having a predetermined distance and area. Inversion protection layer regions 62 may be formed beneath isolation layer regions 63. A semiconductor circuit component is formed in each region 64.

Microminiaturization and high-density integration of a semiconductor device have been difficult because the isolation regions require the predetermined distance and area.

SUMMARY OF THE INVENTION

It is a primary object of the present invention to provide greater microminiaturization and high-density integration of such semiconductor devices.

The above and other objects are achieved, according to the present invention, by providing a semiconductor device having steps or grooves formed in the surface of the semiconductor substrate and isolation regions formed on the steps, or on the side walls of the grooves.

Impurities diffusion layers are provided on the plane surface of the semiconductor substrate which become active regions. Since the step or the side wall of the groove is utilized as the isolation region, it is possible to reduce the size of each isolation region as viewed in the plane of the semiconductor substrate surface. It is further made possible to form the isolation regions in a self-aligned manner and, hence, to reduce the effective size of the isolation region, with respect to the above-mentioned plane, down to the thickness of the isolation layer.

DESCRIPTION OF THE PREFERRED EMBODIMENTS

Figure 1:
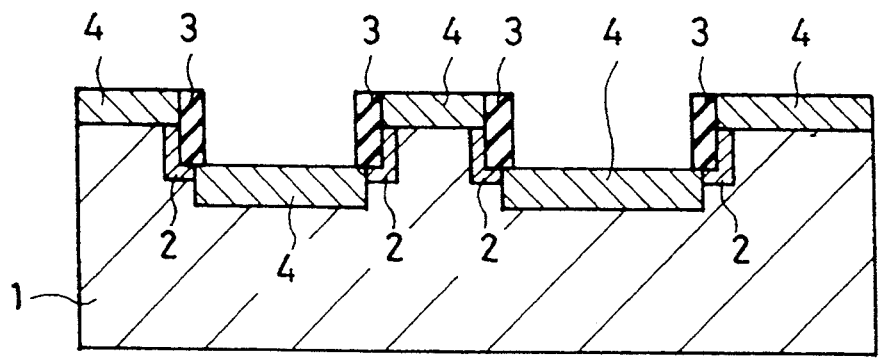
FIG. 1 is a cross-sectional view of a semiconductor device according to a first embodiment of the invention.

FIG. 1 is a cross-sectional view of a semiconductor device according to a first embodiment. As shown in FIG. 1, steps, i.e. the side walls of grooves, are formed in a semiconductor substrate 1 to extend from the surface of substrate 1 in the direction of the thickness of substrate 1 so as to serve as sites for isolation layers 3. Impurity diffusion layers, or regions 4 are sandwiched between the isolation layers 3. Further, inversion protection layers 2 exist on the side walls on the lower portions and back surfaces of isolation layers 3. The isolation layers 3 physically and electrically insulate the impurity diffusion layers 4 from each other.

The isolation layers 3 are usually composed of an insulating film such as an oxide film or a nitride film. When the isolation layers 3 are composed of an insulating film, the thickness thereof is determined under consideration of the breakdown voltage of the insulating film.

The inversion protection layers 2 serve to prevent the semiconductor substrate 1 from having an inversely conducting zone along the isolation layers and, usually, have the same type of electric conductivity as the semiconductor substrate 1 and an impurity concentration greater than that of the substrate. The inversion protection layers 2 are not necessary if there is no probability of the occurrence of inversion. Though FIG. 1 shows only the impurity diffusion layers 4, it will be readily understood that elements such as transistors, resistors and capacitors may be formed as a matter of course in these layers.

Here, FIG. 1 shows vertical steps and their depths determine the length of isolation. As will be easily understood, however, the length of isolation is only nearly equal to the thickness of the isolation layers 3 as viewed on a plane parallel to the substrate surface. Though local oxidation may require isolation layers having a length of greater than 1 μm, in forming a mask, there is no need to give consideration to a portion that corresponds to the length of isolation. The impurity diffusion layers 4 can be formed in a self-aligned manner, too.

Figure 2:
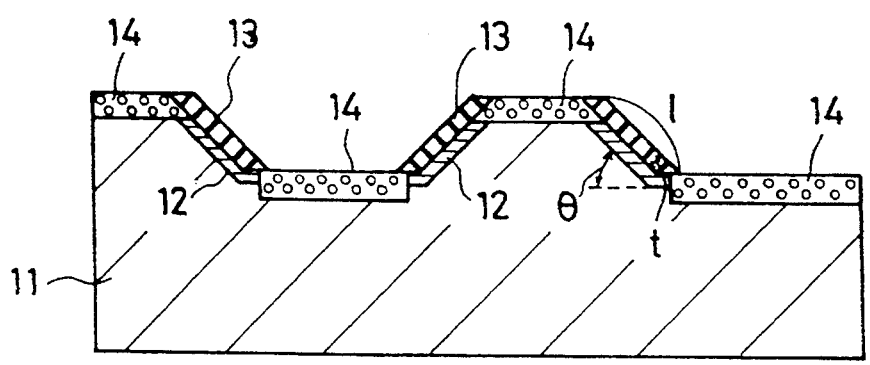
FIG. 2 is a cross-sectional view of a semiconductor device according to a second embodiment of the invention.

FIG. 1 shows vertical steps. The same result, however, holds true even for inclined steps. FIG. 2 is a cross-sectional view of a semiconductor device according to a second embodiment. That is, as shown in FIG. 2, isolation layers 13 are formed on steps in the form of inclined planes, i.e. planes which form an acute angle with the substrate surface. In the case of the steps along inclined planes shown in FIG. 2, the length of substantial isolation corresponds to the length of the step and becomes shorter when viewed from above, i.e. with respect to a plane parallel to the substrate surface. If the length of the inclined plane step is denoted by l and the angle of inclination of the inclined plane relative to the horizontal plane by Θ, then the apparent length of isolation when viewed in the horizontal plane becomes l cos Θ. Therefore, though the length, or width, of isolation of FIG. 2 as viewed on a horizontal plane becomes longer than that of the isolation on the vertical steps shown in FIG. 1, the apparent length is still shorter than the substantial isolation. When the mask is to be formed, furthermore, there is no need of giving consideration to a portion that corresponds to the length of isolation; i.e., the length of isolation ls determined in a self-aligned manner. That is, the length of isolation is determined by the length of the inclined plane or by the step.

A feature of the isolation layer of the present invention, is that there is no need to give consideration to the length, or width, of the isolation layer at the time of forming the mask since it is permitted not only to reduce the length, or width, of the isolation layer with respect to the horizontal plane, but also to determine the length in a self-aligned manner. In FIG. 2, if the length of the inclined plane is denoted by l, the inclination of the inclined plane relative to the horizontal plane of the substrate surface by $\Theta$ and the thickness of the isolation layer by t, then the apparent length, or width, of the isolation layer according to the present invention, when viewed from with respect to the horizontal plane, becomes nearly equal to $l \cos \Theta + t/\sin \Theta$. From this equation, the length, or width, of the isolation layer becomes the smallest when $\Theta = 90°$ and becomes equal to the thickness t of the isolation layer.

FIG. 2 further shows impurity diffusion layers 14 and inversion protection layers 12.

Figure 3:
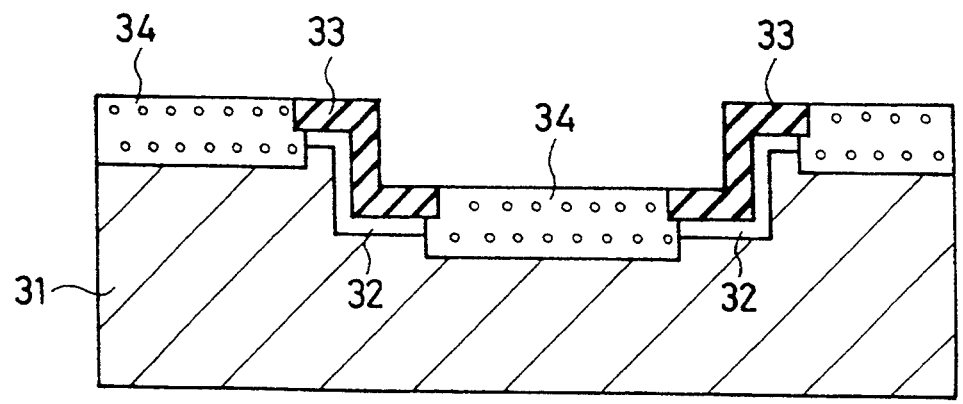
FIG. 3 is a cross-sectional view of 3 semiconductor device according to a third embodiment of the invention.
Figure 4:
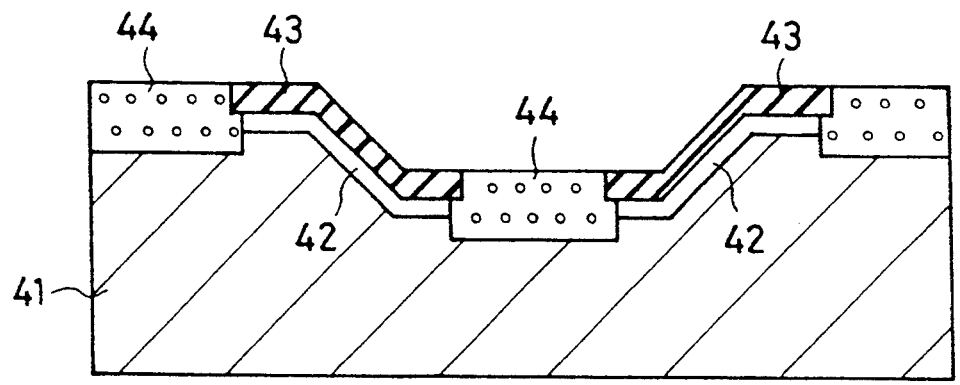
FIG. 4 is a cross-sectional view of a semiconductor device according to a fourth embodiment of the invention.

FIGS. 1 and 2 illustrate devices in which the isolation layers were formed on steps in the surface of the semiconductor substrate. It is, however, also allowable to form the isolation layers on regions adjacent, and contiguous with, the steps as well as on the steps themselves, as shown in FIGS. 3 and 4 which are cross-sectional views of semiconductor devices according to third and fourth embodiments, respectively. That is, referring to FIGS. 3 and 4, the isolation layers 33 and 43 are formed not only on the vertical or inclined steps but also on the flat, or horizontal, plane portions adjacent the steps. In these cases, it need not be pointed out that a particular mask is necessary for creating the isolation regions. However, the width of each isolation region can be reduced with respect to the plane of the substrate surface, as viewed from above, compared with the case when the isolation regions are formed on flat horizontal surface portions only. It is, as a matter of course, allowable to use isolation regions in accordance with the present invention in a device in combination with the conventional isolation layers that are formed on the flat portions only.

FIG. 3 shows the case where vertical steps are provided. It, however, need not be pointed out that the matters described with reference to FIG. 3 can also be adapted to the steps of inclined planes as shown in FIG. 4. FIGS. 3 and 4 further show impurity diffusion regions 34 and 44 and inversion protection layers, or regions, 32 and 42.

Figure 5:
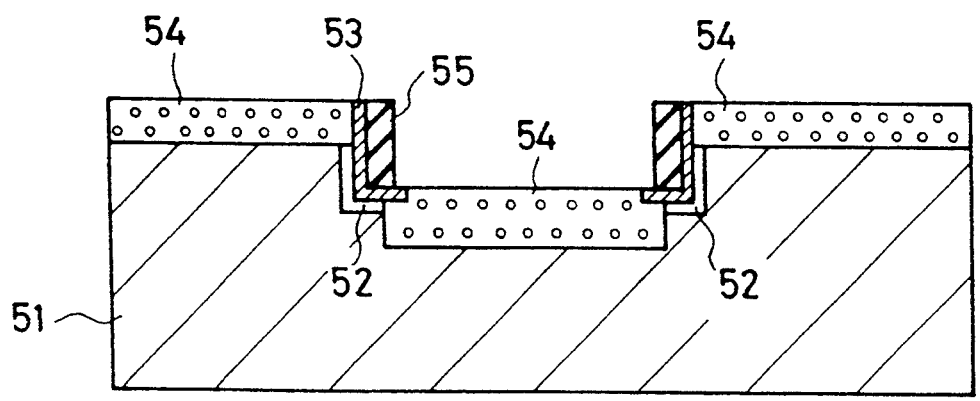
FIG. 5 is a cross-sectional view of a semiconductor device according to a fifth embodiment of the invention.
Figure 6:
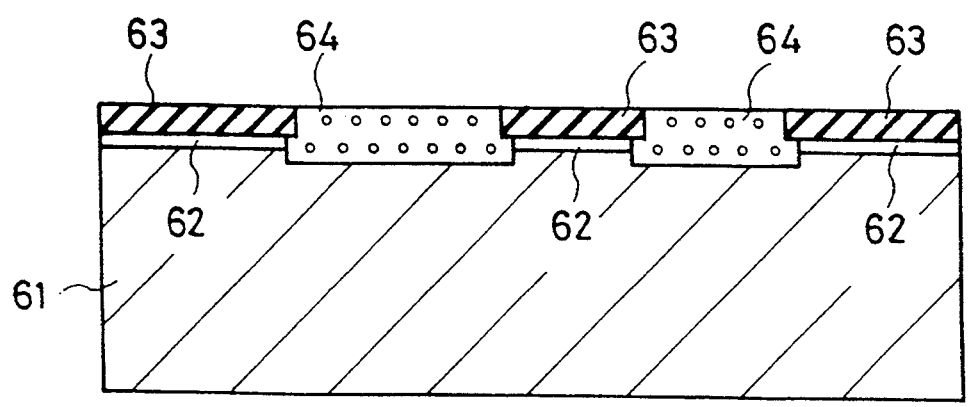
FIG. 6 is a cross-sectional view showing a conventional semiconductor device.

According to a further embodiment, the present invention can be adapted to an isolation method which electrically isolates the elements, as shown in FIG. 5 which is a cross-sectional view of a semiconductor device according to a fifth embodiment. That is, as shown in FIG. 5, a step is formed in a region of isolation, and an insulating film 53 and an electrode 55 for isolation are formed on the step. The insulating film 53 and the electrode 55 for isolation are equivalent to the isolation layer described in conjunction with FIGS. 1 to 4. The isolation regions formed by films 53 and electrodes 55 separate impurity diffusion regions 54 and overly inversion protection regions 52.

By adjusting a voltage applied to the electrode 55 for isolation, it is possible to isolate the impurity diffusion layers, or element regions, 54 from each other. Further, the structure described with reference to FIG. 5 can also be adapted to the case of steps forming inclined planes.

Though FIGS. 1 to 5 illustrate simple structures dealing chiefly with the isolation regions, it need not be pointed out that the semiconductor devices will be completed by forming wiring layers, interlayer insulating films and protection layers in addition to the structures diagrammed above.

FIGS. 7a to 7h show a specific sequence of steps for forming the isolation structure of FIG. 1. In the first step, FIG. 7a, photoresist 72 is patterned on the semiconductor substrate 1. A semiconductor substrate made of a single element such as silicon or germanium, or a semiconducting compound such as GaAs, InP is used as the semiconductor substrate 1. In the second step, FIG. 7b, a region where photoresist 2 is not present on semiconductor substrate 1, is etched by a dry etching method or wet etching method and a groove 73 is formed. The depth of the etched portion in the semiconductor substrate 1 represents the isolation width according to the present invention. Accordingly, the etching quantity, or etching depth, is determined by the required isolation width.

Figure 7A:
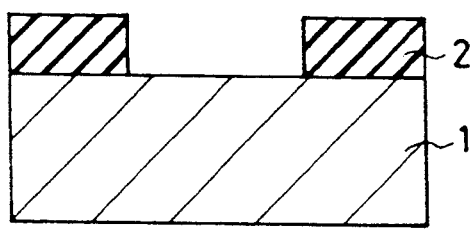
FIGS. 7a to 7h are cross-sectional views illustrating a specific sequence of steps for forming the novel isolation structure of FIG. 1.
Figure 7B:
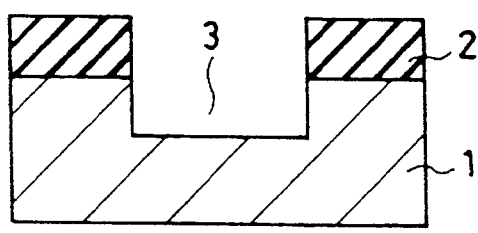
Figure 7C:
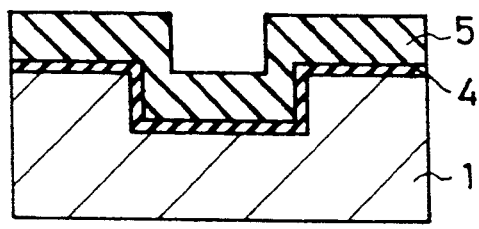

In the third step, FIG. 7c, after removal of the photoresist 72, a thin insulation film 74 is formed and a silicon nitride film 5 is deposited on thin insulation film 74. The insulation film 74 is made of silicon oxide or silicon oxynitride. The thickness of insulation film 74 is preferably 100–1000Å. The silicon nitride film 5 functions as an oxidation resistant mask. Other materials which resist oxidation can be used as the oxidation resistant mask instead of silicon nitride. The thickness of the silicon nitride film 5 is usually about 200–1000 Å so as to have no pin holes and an adequate oxidation-resistance. A chemical vapor deposition method (CVD method) or a physical vapor deposition method (PVD method) is used for forming the silicon nitride film 5.

Figure 7D:
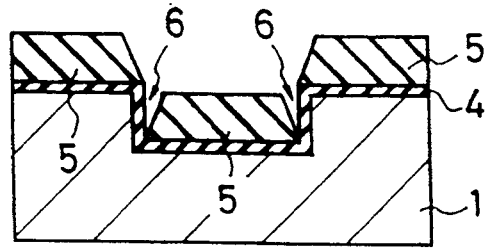

In the fourth step, FIG. 7d, the silicon nitride film 5 is removed from the step surfaces. The silicon nitride film 5 deposited on the step surfaces is removed more rapidly than that on the horizontal surface portions since the silicon nitride film 5 deposited on the vertical step surfaces by a CVD method or PVD method is etched more easily than that on the horizontal surface portions. Isotropic etching is more effective than anisotropic etching to form the regions 6 which are free of the silicon nitride film 5. Namely, wet etching or isotropic dry etching is more effective to etch away the silicon nitride film on the step surfaces while the silicon nitride film is left on the horizontal surface portions, especially when the silicon nitride film 5 has been formed by a plasma CVD method or a sputtering method since the silicon nitride film formed by such methods is very fragile.

Figure 7E:
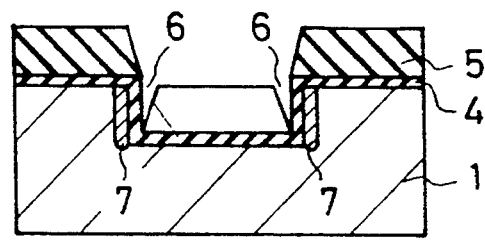
Figure 7F:
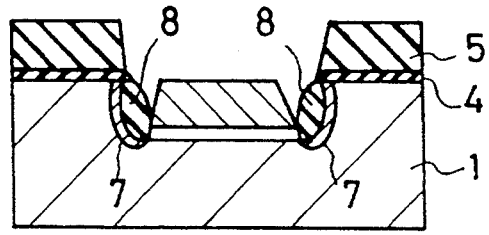

In the fifth step, FIG. 7e, inversion protection layer regions 2 are formed by introducing impurities into the regions 6, i.e. at the step surfaces where no silicon nitride film is present, to protect against field inversion. The impurities are introduced using an ion implementation method or a diffusion method. In the sixth step, FIG. 7f, insulating film regions 3 for isolation are formed at regions 6 which are free of silicon nitride film by oxidizing the semiconductor substrate 1. The insulating film regions 3 are composed of silicon oxide when the substrate 1 is made of silicon.

Figure 7G:
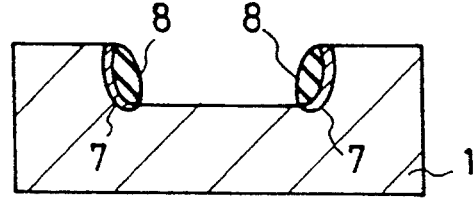
Figure 7H:
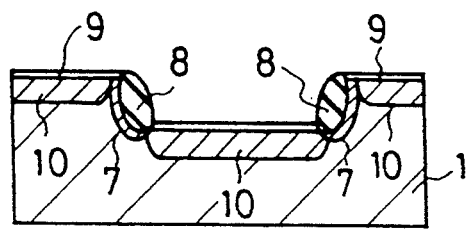

In the seventh step, FIG. 7g, the silicon nitride film 5 and the thin insulating film 74 are removed. The regions outside of the insulating film regions 3 for isolation are active regions. For example, as shown in FIG. 7h, impurity diffusion layers 4 are formed by ion implantation through a thin insulating film 9 previously formed on the surface portion of the semiconductor substrate. Then, the semiconductor device is completed by forming transistors, metal lines and passivation layers.

The process described above is one embodiment for producing the structure shown in FIG. 1. Needless to say, there are various other methods to produce the structure.

The structures shown in FIGS. 2 to 5 may also be produced by methods similar to the one described above.

In semiconductor devices of the present invention as described above, the isolation regions are formed on the steps that are formed in the surface of the semiconductor substrate so as to decrease the width and the area of the isolation layers, when considered with respect to the horizontal plane of the surface of substrate 1. In particular, the width of the isolation regions when viewed from above can be reduced down to the thickness of the isolation layer. Moreover, the isolation regions are formed on the steps in a self-aligned manner. Therefore, semiconductor devices can be fabricated in a highly integrated form.

This application relates to subject matter disclosed in Japanese Application No. 2-94773, filed on Apr. 9, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for making a semiconductor device in a semiconductor substrate having a surface, the device including an isolation layer region formed on a side wall of a groove provided in a portion of the surface of the semiconductor substrate and at least two separate active regions isolated from one another by the isolation layer region, said method comprising the steps of:

forming a pattern of photoresist on said semiconductor substrate surface such that a portion of the surface is exposed;

forming a groove in said substrate at the exposed portion so that the groove has side walls which form an angle with the substrate surface;

removing the photoresist, forming a thin insulation film on the substrate surface and in the groove, and depositing a silicon nitride film on the thin insulation film;

removing the silicon nitride film from the side walls of the groove thereby leaving remaining portions of the silicon nitride film;

forming an inversion protection layer by introducing impurities into the side walls from which the silicon nitride film has been removed;

forming insulation films constituting isolation layer regions on the side walls from which the silicon nitride film has been removed by oxidizing said semiconductor substrate;

removing the remaining portions of the silicon nitride film and the thin insulating film; and forming impurity diffusion regions constituting separate active regions in portions of the substrate separated by an isolation layer region.

2. A method as defined in claim 1 wherein said step of forming impurity diffusion regions comprises: forming a thin insulating film on the portions of the substrate separated by an isolation layer region; and ion implanting impurities through the thin insulating film.

* * * * *